United States Patent [19]
Yamada

[11] Patent Number: 5,610,863
[45] Date of Patent: Mar. 11, 1997

[54] MEMORY DEVICE HAVING A BOOSTER CIRCUIT AND A BOOSTER CIRCUIT CONTROL METHOD

[75] Inventor: Toyonobu Yamada, Kawasaki, Japan

[73] Assignee: Fujitsu Limited, Kawasaki, Japan

[21] Appl. No.: 655,915

[22] Filed: May 31, 1996

[30] Foreign Application Priority Data

Nov. 29, 1995 [JP] Japan .................................. 7-310206

[51] Int. Cl.⁶ ...................................................... G11C 7/00
[52] U.S. Cl. .................... 365/189.09; 365/194; 365/226; 365/230.06
[58] Field of Search .............................. 365/189.09, 226, 365/194, 230.06

[56] References Cited

U.S. PATENT DOCUMENTS 4,673,829  6/1987  Gupta .................................. 365/189.09

Primary Examiner—Joseph E. Clawson, Jr.
Attorney, Agent, or Firm—Staas & Halsey

[57] ABSTRACT

This invention relates to a memory device internally employing an active period control signal for controlling an active period and an inactive period for internal operation. The memory device comprises a plurality of word lines and bit lines; memory cells provided at intersections thereof; a booster circuit, having an output terminal, for outputting to the output terminal a higher voltage than a power source voltage; and word drivers, connected to each of the word lines, for connecting the output terminal of the booster circuit to a corresponding word line in response to a word selection signals provided during the active period. The memory device also comprises a boosting control signal generation circuit supplying the booster circuit with a boosting control signal to continue a boosting operation of the booster circuit longer than the active period in response to the active period control signal. The output of the booster circuit can recover appropriate voltage level after the termination of the active period so that the error read operation can be avoided.

8 Claims, 6 Drawing Sheets

MEMORY DEVICE HAVING A BOOSTER CIRCUIT AND A BOOSTER CIRCUIT CONTROL METHOD

BACKGROUND OF THE INVENTION

1. Field of the Invention

The present invention relates to a semiconductor device, such as a DRAM (Dynamic Random Access Memory), and in particular to a memory device having a booster circuit that supplies a selection level for a word line, and to a control method for a booster circuit.

2. Related Arts

For a conventional semiconductor memory device, such as a DRAM, memory cells having a single selection transistor and a capacitor for storing memory data are provided at each intersection of a word line and a bit line. A selected word line is activated at a selected high level, a selected transistor is rendered on, the level of a bit line is changed in accordance with whether or not electric charges have been accumulated in the capacitor, and a sense amplifier circuit connected to the bit line reads the slight change in the bit line.

For the normal operation of the DRAM, a pre-charge period, during which the level of a bit line, etc., is precharged, and an active period, during which the word line is activated as described above and data in the memory cells are read, are alternately repeated.

In accordance with the increase in the capacity of the memory device, the volume of the electric charge accumulated in the capacitor of the memory cell is reduced compared with the capacity of the bit line. In order to ensure that data can be read, the selection level of a selected word line is set to be higher than a power source voltage. Therefore, a booster circuit is provided which supplies the voltage higher than the power source voltage to a word line driver circuit connected to the word line.

In FIG. 6, a timing chart for a DRAM is used for explaining the operation of such a booster circuit. In the booster circuit, generally, a pumping pulse (boosting pulse) from an oscillator, such as a ring oscillator, is applied to one of the electrodes of the capacitor in the booster circuit, so as to boost the output voltage at the other electrode. Further, in order to save the power consumption, the boosting pulse is supplied to the booster circuit for performing the boosting operation only during the active period while the word line is activated. Usually, the active period is controlled by a /RAS (RAS bar) signal, which is an inversion of an RAS (Row Address Strobe) signal. In other words, the period corresponding to the emission of the low-level /RAS signal, during which a valid Row address signals are supplied, is the active period, while the period corresponding to the emission of a high-level /RAS signal is the pre-charge period.

As is shown in FIG. 6, as the selected word line WL rises, voltage Vpp at a boosting level is first dropped, and is then returned by the boosting pulse so as to prepare for the succeeding active period.

However, in accordance with the recent increase in the memory capacities, the number of memory cells connected to a single word line has increased, and in addition, as the word lines become minute, the parasitic capacity of an individual word line has become larger. Thus, since a reduction in the voltage Vpp at the boosting level that is to be supplied from the boosting circuit to the selected word line tends to be greater (Vpp2 in FIG. 6), the boosting load is increased. In addition, since a shorter cycle is required in accordance with the higher memory speed, the active period is shortened. As a result, for the boosting operation during the active period in the conventional manner, level Vpp3 can not be returned to the original level Vpp1, and in the active period of the next cycle, the voltage level available for a selected word line is reduced to Vpp4, so that it is not possible to adequately read data in the memory cell.

To resolve these shortcomings, it could be proposed that the capacity of a ballast capacitor at the output section of a booster circuit be increased, and that the capacity of the capacitor of the booster circuit be increased to enhance the ability of the boosting circuit. However, neither solution is the preferable one because these solution yield larger dimensions of the capacitors which will not matches the requirement of the large capacity and high integration for the semiconductor memory.

It is, therefore, one object of the present invention to provide a memory device having a boosting circuit that can fully recover the level of the boosting voltage supplied to the selected word line.

It is another object of the present invention to provide a memory device having an improved booster circuit with matching an increase of memory capacity, so that a level for a selected word line can be maintained high enough for adequately reading data.

It is an additional object of the present invention to provide a memory device that, without requiring a drastic increase in the consumed power, can prevent a reduction in a voltage level of a selected word line by enhancing the boosting operation of a booster circuit.

SUMMARY OF THE INVENTION

To achieve the above objects, a memory device, internally employing an active period control signal for controlling an active period and an inactive period for internal operation, comprises:

a plurality of word lines;

a plurality of bit lines;

memory cells provided at intersection of the word lines and the bit lines;

a booster circuit, having an output terminal, for outputting to the output terminal a higher voltage than a power source voltage;

word drivers, connected to each of the word lines, for connecting the output terminal of the booster circuit to a corresponding word line in response to a word selection signal provided during the active period; and a boosting control signal generation means for supplying the booster circuit with a boosting control signal to continue a boosting operation of the booster circuit longer than the active period in response to the active period control signal.

Since the boosting is continued even when the active period has ended and the inactive period which is a precharge period is begun, the output voltage of the booster circuit can be returned to a sufficiently high level.

A /RAS signal of the memory, for example, may be employed as the active period control signal.

DETAILED DESCRIPTION OF THE PREFERRED EMBODIMENT

The preferred embodiment of the present invention will now be described while referring to the accompanying drawings. It is apparent that the technical of the present invention, however, is not limited to the example circuit, etc., in this embodiment.

[Circuit structure of a memory device]

Figure 1:
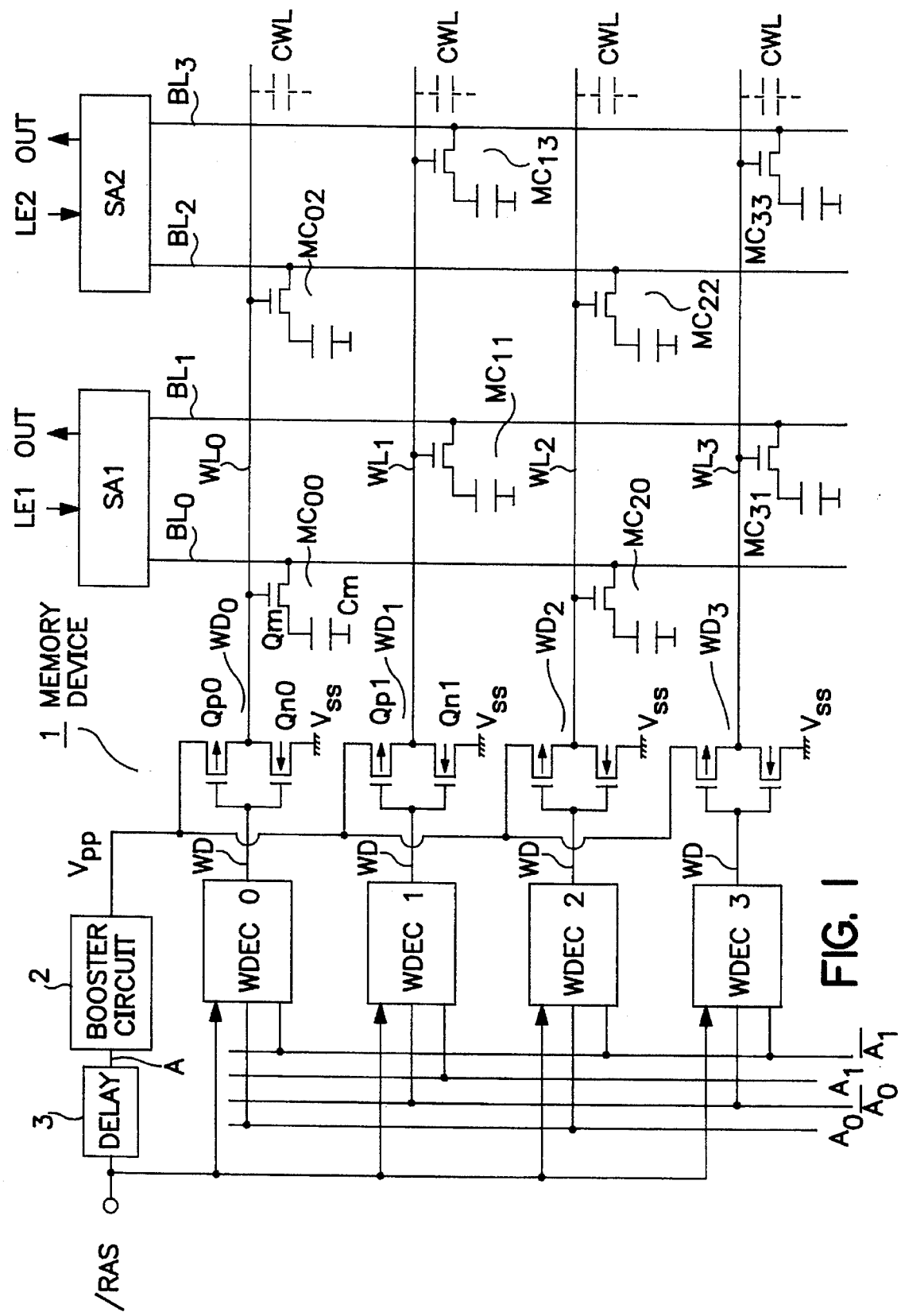
FIG. 1 is a general circuit diagram for illustrating a memory device.

FIG. 1 is a general circuit diagram illustrating a memory device. A plurality of word lines WL0 through WL3, a plurality of bit lines BL0 through BL3 provided for intersecting the word lines WL, and memory cells MC00 through MC33 provided at the intersections, are the basic structural elements of the memory device. The word lines WL are connected to word drivers WD0 through WD3, each of which is, for example, a CMOS inverter constituted by a P-channel transistor Qp0 and an N channel transistor Qn0. The bit lines BL are connected to sense amplifiers SA1 and SA2 respectively.

When the word drivers WD0 through WD3 receive selection signals WD falling to L level from the word decoders WDEC0 through WDEC 3, the word drivers WD render the P-channel transistors on, and supply a voltage Vpp from a booster circuit 2 to the respective word lines WL. Each word decoder WDEC is connected to inverted and non-inverted address signal lines A0 and A1 from an address buffer circuit (not shown) with a predetermined combinations, and receives the combined inverted and non-inverted signals as input signals.

The entire operation of the memory device is controlled by the pre-charge period and the active period, as is mentioned above. These periods are controlled in accordance with a /RAS signal. In the embodiment of the present invention shown in FIG. 1, a control signal for rendering the booster circuit 2 active is not a conventional /RAS signal, but is a boosting operation control signal A obtained by delaying the /RAS signal. More specifically, as will be described later, the boosting operation control signal A is a signal obtained by delaying only the rising timing of the /RAS signal. With this signal, the active condition of the booster circuit 2 can be continued for a longer time than the active period for the memory. As illustrated, means 3 for generating the boosting operation control signal A is basically constituted by a delay circuit.

Figure 2:
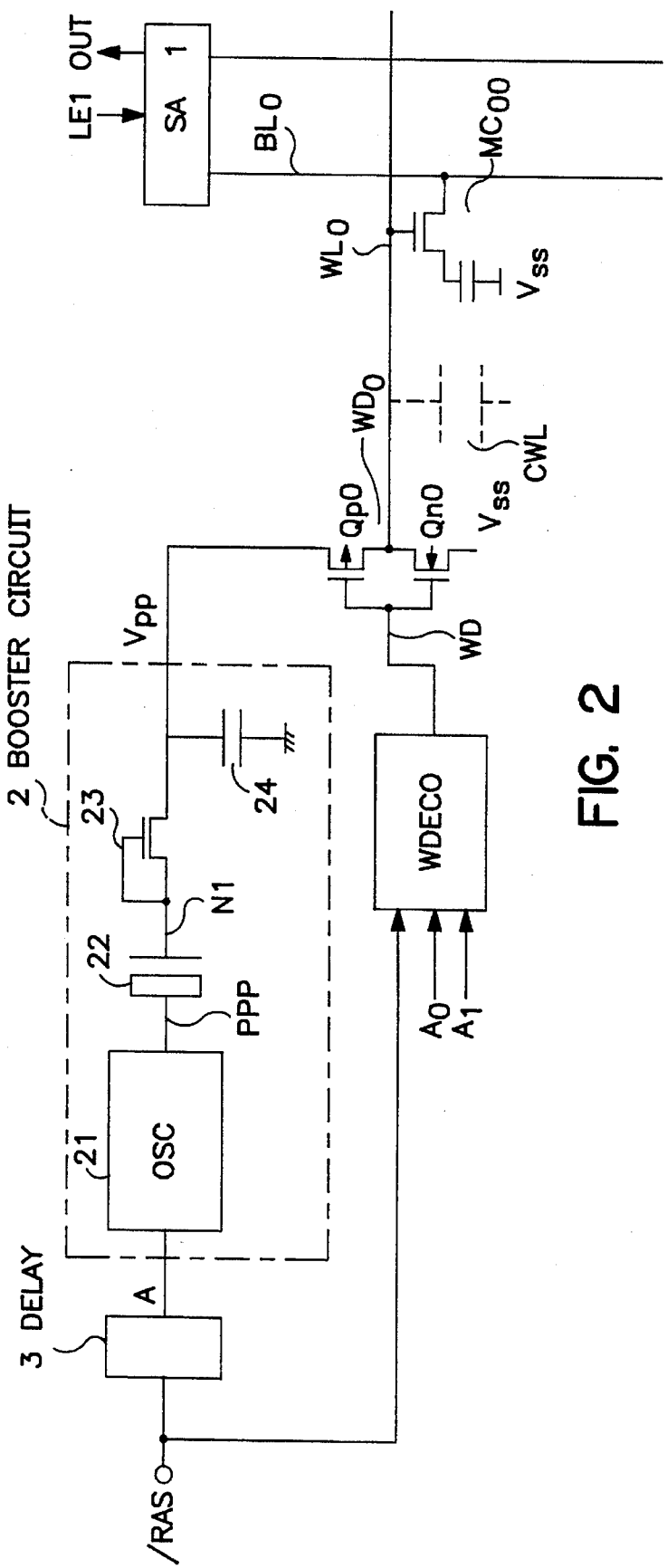
FIG. 2 is a schematic diagram illustrating the internal structure of a booster circuit.

FIG. 2 is a schematic diagram illustrating one part of the complete circuit shown in FIG. 1, and the booster circuit 2. The booster circuit 2 comprises basically an oscillator 21 for performing oscillation in response to the control signal A; a capacitor 22 for boosting a node N1 by a boosting pulse or a push-pull pulse PPP which is the output of the oscillator 21; a diode circuit 23 for outputting a voltage of the node N1; and a ballast capacitor 24 connected to the output terminal Vpp. This is the basic structure. Modifications of this structure can also be employed.

[Explanation of operation]

The operation of the memory device shown in FIG. 1 or FIG. 2 will now be described while referring to the timing chart in FIG. 3.

First, the active period and the pre-charge period for the entire operation of the memory are controlled by using the /RAS signal, as is described above. The control signal A for the booster circuit 2 is a signal obtained by delaying the rising edge of the /RAS signal. As is shown in FIG. 3, the control signal A is substantially synchronized with and does not delay the fall of the /RAS signal, and its rise occurs a predetermined time later than the rise of the /RAS signal. In other words, the L-level period tpp of the control signal A is longer than the active period.

The operation will be explained for a case wherein memory cell MC00 connected to the word line WL0 and the bit line BL0 is selected. During the active period, first, the word line selection signal WD from the selected word decoder WDEC1 falls in response to the fall of the /RAS signal. In response to this, the P-channel transistor Qp0 of the word driver WD0 is rendered on. The fall of the /RAS signal is transmitted to the control signal A with almost no delay. The oscillator 21 then oscillates and outputs the boosting pulse or push-pull pulse PPP. The output Vpp of the booster circuit 2 is transmitted to the selected word line WL0 across the P-channel transistor Qp0 of the word driver WD0.

As a result, the electric potential of the selected word line WL0 rises. At the same time, the voltage level Vpp is reduced to the level according to the ratio of the capacity of the ballast capacitor 24 in the booster circuit 2 to the parasite capacity CWL of the word line WL, i.e., to the Vpp2 level in FIG. 3. As the electric potential of the word line WL rises, the transistor Qm of the memory cell MC00 is rendered on and transmits the charge accumulation condition of the capacitor Cm to the bit line BL. Thus, the electric potential of the bit line BL is increased or decreased in accordance with the charge accumulation condition of the capacitor Cm for the memory cell MC00. Since the level of the increase or decrease is very minute, the sense amplifier SA1 becomes active through supplying a latch signal LE1 in order to amplify the level change of the bit line BL, that is very minute. A signal amplified by the sense amplifier SA1 is output to the exterior as a read signal OUT via an output buffer (not shown). While at the same time, rewriting to the memory cell MC00 is performed in accordance with the amplified level of the bit line BL.

Following this, in synchronization with the rising edge of the /RAS signal, which indicates the end of the active period, the word line selection signal WD from the word decoder WDEC rises to H level, indicating a non-selection state. As a result, the N-channel transistor Qn0 of the word driver WD0 is rendered on, and the electric potential of the word line WL is dropped to ground potential Vss. At the same time, the P-channel transistor Qp0 of the word driver WD0 is rendered off, and the output Vpp of the booster circuit 2 is separated from the selection word line. The electric potential of the bit line BL is pre-charged to an intermediate level during the pre-charge period, and the bit line BL waits for the next active period.

According to the present invention, the oscillator 21 of the booster circuit 2 is controlled by the boosting operation control signal A, which is obtained by delaying the timing for the rise of the /RAS signal. Therefore, even when the /RAS signal rises and the pre-charge period begins, the oscillator 21 continuous to output the boosting or push-pull pulse PPP. Thus, the output Vpp of the booster circuit 2 continues to rise for a while after the pre-charge period begins, and recovers to the level Vpp3, which is the same as the original level Vpp1. In the following active period, a sufficiently high voltage level can be supplied to the selection word line. As a result, the voltage level Vpp (the electric potential of the selected word line WL) to be reduced when the output of the booster circuit 2 is connected to the word line WL can be Vpp4, as is shown in FIG. 3, which is high enough to read information from the memory cell. In particular, when the pre-charge period has begun and after the P-channel transistor is rendered off and the selected word line is separated from the output of the booster circuit 2, the booster circuit 2 continues boosting while the output capacity connected thereto is reduced so that the boosting speed is faster.

In this embodiment of the present invention, as only the operation period for the oscillator 21 is extended without increasing the capacities of the capacitors 22 and 24 in the booster circuit 2, the ability of the booster circuit 2 is improved. It is preferable that the operation period for the booster circuit 2 be shortened as much as possible to save the power consumption. Thus, the active period of the booster circuit 2 needs only to be so extended that the voltage level Vpp will not be reduced to the level at which reading is impossible, while reading is performed at the shortest cycle guaranteed by the memory device. When the necessary push-pull period is ended, the operation is immediately halted to prevent the waste of power.

As is described above, the rise of the control signal A needs only to be delayed a minimum time relative to the /RAS signal. When the cycle time for the complete memory device is long, the active period for the memory device is also long, and only a small delay is required for the control signal A of the booster circuit 2. On the other hand, when the cycle time is shortened, as the active period for the memory device is also short and a large delay is provided for the control signal A, the conventional problems can be resolved with the minimum consumption of power. In this manner, the rising of the control signal A is delayed for a necessary period of time in accordance with the length of the active period. In addition, for a special case wherein a single memory device has both a short cycle time and a long cycle time, the delay for the rise of the control signal A can be dynamically changed in accordance with the length of the L-level period for an input /RAS signal.

[Booster circuit and boosting control signal generation means]

Figure 4:
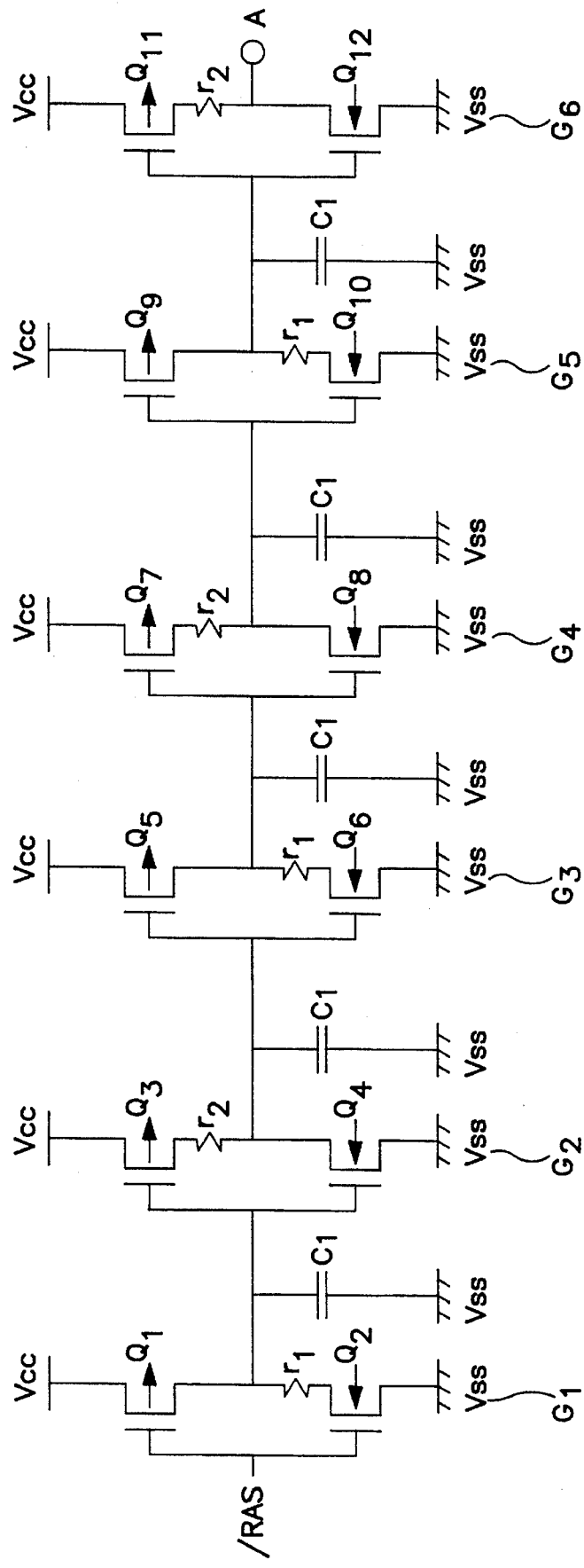
FIG. 4 is a diagram illustrating an example of boosting control signal generation means.

FIG. 4 is a diagram illustrating an example of the delay circuit 3, which is the boosting control signal generation means according to the embodiment of the present invention. In this example circuit, gates G1 through G6 having a hysteresis property at the rising and the falling edges are connected in series. Each gate is constituted by a CMOS inverter circuit, including a P-channel transistor and an N-channel transistor. Since resistors R1 and R2 and a capacitor C1 are located as is shown in FIG. 4, in the gate circuits G1, G3 and G5, at the odd-numbered stages, output signals fall with a delay relative to the rise of an input signal, and rise with almost no delay relative to the fall of the input signal. The operations of the even-numbered gate circuits G2, G4 and G6 are just the opposite. Thus, the control signal A falls with almost no delay relative to the fall of the /RAS signal, and rises with a predetermined delay relative to the rise of the /RAS signal.

It is apparent that the resistor r1 and the capacitor C1 in FIG. 4 can be fabricated in various manners as a semiconductor circuit in a semiconductor device. For example, the resistor r1 can be provided by reducing the channel widths of the N-channel transistors Q2, Q6 and Q10, extending the channel lengths, or setting high threshold values for the channels. Likewise, the resistor r2 can be provided by altering the structure of the P-channel transistor. Therefore, though the delay circuit 3 is provided, there is no substantial increase in the dimensions of an integrated circuit.

Figure 3:
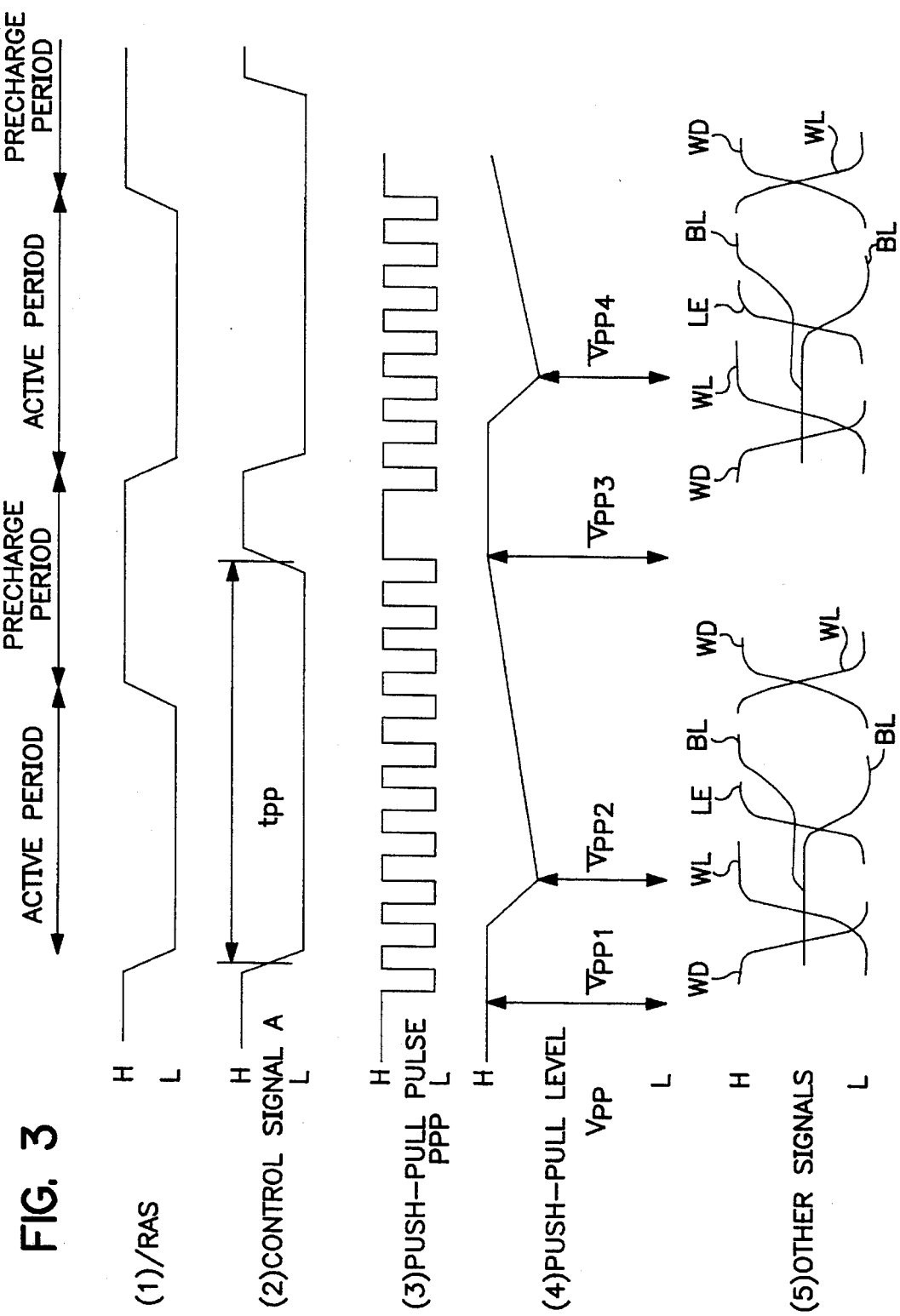
FIG. 3 is a timing chart.

With the above described structure, only the rising edge of the control signal A can be delayed relative to the /RAS signal, as is shown in FIG. 3. The degree of delay can be set to an optimal value, depending on, for example, the number of gates of the delay circuit, or the values of the resistors r1 and r2 and the capacitor C1.

Figure 5:
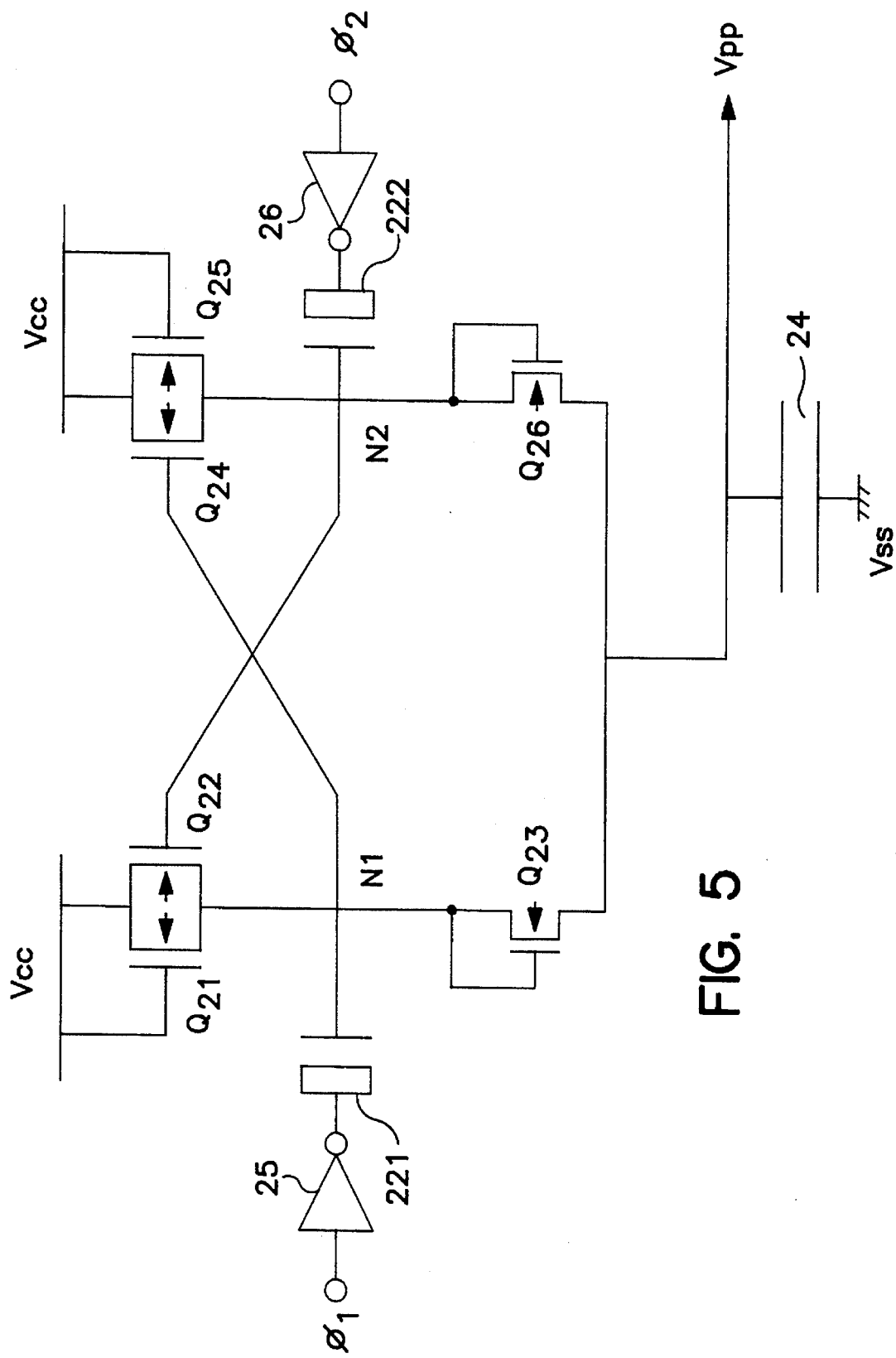
FIG. 5 is a diagram illustrating an example of the booster circuit.
Figure 6:
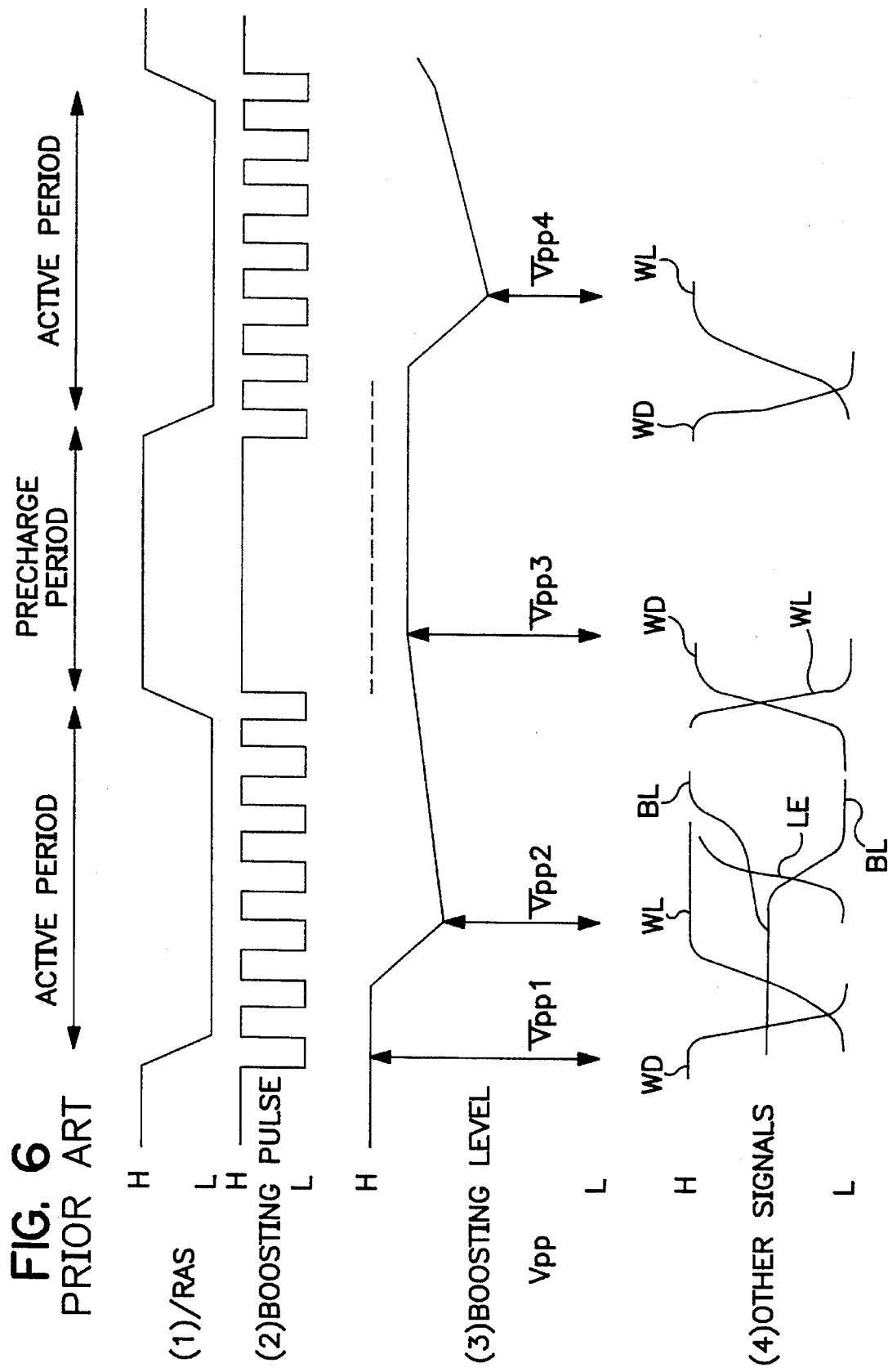
FIG. 6 is a timing chart for prior art.

FIG. 5 is a circuit diagram illustrating an example booster circuit 2. An oscillator 21 for a booster circuit 2 is not shown in this example circuit. As is shown in FIG. 5, the booster circuit comprises six N-channel transistors Q21 through Q26, pumping capacitors 221 and 222, and a ballast capacitor 24. The oscillator 21 (not shown) respectively supplies boosting pulse signals $\phi 1$ and $\phi 2$ with opposite phases, through inverters 25 and 26 to pumping capacitors 221 and 222, which are connected to nodes N1 and N2.

The operation of the circuit is performed as follows. In the initial state, the nodes N1 and N2 have electric potentials that are lower than power source voltage Vcc by a value of a threshold voltage for transistors. Supposing that the boosting pulse signal $\phi 1$ falles, the output of the inverter 25 rises from level L to level H, and the electric potential of the node N1 is raised to Vpp, which is higher than Vcc. As a result, the gate potential of the transistor Q24 also rises to or higher than the power source voltage Vcc, and the potential of the node N2 rises up to the level of the power source voltage Vcc. Next, when the boosting pulse signal $\phi 2$ with the opposite phase rises, the level of the output of the inverter 26 rises, and the electric potential of the node N2 is increased, via the capacitor 222, from the level of the power source voltage Vcc to the push-pull voltage Vpp level higher than Vcc. Accordingly, the electric potential of the node N1 is raised to the power source voltage Vcc level through the transistor Q22. At the succeeding fall of the boosting pulse signal $\phi 1$, the electric potential of the node N1 is increased to the push-pull voltage Vpp level.

The electric potentials of the nodes N1 and N2, which have reached the Vpp level higher than the power source voltage Vcc in the above described manner, are employed to charge the ballast capacitor 24 across the respective diodes Q23 and Q26, so as to raise the output voltage Vpp of the booster circuit 2 to the level higher than the power source voltage Vcc.

As is described above, according to the present invention, since the boosting of the booster circuit 2 is performed longer than the active period, a high voltage required for reading can be satisfactorily supplied to the word line even at a short cycle time, and reliability in the memory can be enhanced.

What I claim are:

1. A memory device, internally employing an active period control signal for controlling an active period and an inactive period for internal operation, comprising:

a plurality of word lines;

a plurality of bit lines;

memory cells provided at intersections of the word lines and the bit lines;

a booster circuit, having an output terminal, for outputting to the output terminal a higher voltage than a power source voltage;

word drivers, connected to each of the word lines, for connecting the output terminal of the booster circuit to a corresponding word line in response to a word selection signals provided during the active period; and a boosting control signal generation circuit supplying the booster circuit with a boosting control signal to continue a boosting operation of the booster circuit longer than the active period in response to the active period control signal.

2. A memory device according to the claim 1, wherein:

the boosting circuit comprises an oscillator outputting a clock pulse signal in response to the boosting control signal and a boosting capacitor to one electrode of which the clock pulse signal is applied and the other electrode of which is operatively connected to the output terminal.

3. A memory device according to the claim 1, wherein:

said boosting control signal changes into a first level for performing the boosting operation in response to a first change of the active period control signal for controlling the start of the active period, and changes into a second level for terminating the boosting operation at a predetermined time delay after a second change of the active period control signal for controlling the termination of the active period.

4. A memory device according to the claim 3 wherein:

the word selection signal is supplied to the word driver in response to the first change of the active period control signal, and the selected word line is separated from the output of the booster circuit in response to the second change of the active period control signal.

5. A memory device according to claim 1, wherein:

the boosting control signal generation circuit comprises a plurality of first inverters and second inverters connected alternately, either the rising speed or the falling speed of the first inverter is different from the second inverter.

6. A memory device according to claim 1, wherein:

the word driver comprises a CMOS inverter including P-channel MOS transistor and N-channel MOS transistor connected together, the gate electrodes of both transistors are supplied with the word selection signal, the connecting point of the one electrode of the transistors is operatively connected to the corresponding word line, and the other electrode of the P-channel MOS transistor is operatively connected the output of the booster circuit.

7. Method of controlling a booster circuit employed in a memory device, said memory device comprising, a plurality of word lines;

a plurality of bit lines;

memory cells provided at intersections of the word lines and the bit lines;

a booster circuit, having an output terminal, for outputting to the output terminal a higher voltage than a power source voltage; and word drivers, connected to each of the word lines, for connecting the output terminal of the booster circuit to a corresponding word line in response to a word selection signals provided during the active period;

the method of controlling a booster circuit comprising a step of having the booster circuit perform the boosting operation longer than the active period in response to the active period control signal.

8. Method of controlling the booster circuit of the claim 7, wherein the step of boosting operation includes;

a first step of starting the boosting operation in response to a first change of the active period control signal for controlling the start of the active period; and a second step of terminating the boosting operation at a predetermined time delay after a second change of the active period control signal for controlling the termination of the active period.

* * * * *